(12) United States Patent
Mori (10) Patent No.: US 11,367,470 B2
(45) Date of Patent: Jun. 21, 2022

(54) MEMORY CONTROLLER

(71) Applicant: Winbond Electronics Corp., Taichung (TW)

(72) Inventor: Kaoru Mori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/321,523

(22) Filed: May 17, 2021

(65) Prior Publication Data

US 2021/0398572 A1 Dec. 23, 2021

(30) Foreign Application Priority Data

Jun. 23, 2020 (JP) .............................. JP2020-107885

(51) Int. Cl.
*G11C 7/00* (2006.01)
*G11C 7/10* (2006.01)
*G11C 11/4076* (2006.01)
*G11C 11/406* (2006.01)

(52) U.S. Cl.
CPC ............ *G11C 7/1045* (2013.01); *G11C 7/106* (2013.01); *G11C 7/1096* (2013.01); *G11C 11/4076* (2013.01); *G11C 11/40615* (2013.01)

(58) Field of Classification Search
CPC .................................................. G11C 11/40615
USPC ......................................................... 365/222
See application file for complete search history.

(56) References Cited

U.S. PATENT DOCUMENTS 8,773,179 B2 7/2014 Chang et al.
2003/0103407 A1\* 6/2003 Ooishi ................. G11C 7/1045
365/233.12

FOREIGN PATENT DOCUMENTS

CN 1697077 11/2005
TW I306265 2/2009

\* cited by examiner

*Primary Examiner* — Hoai V Ho
(74) *Attorney, Agent, or Firm* — JCIPRNET (57) ABSTRACT

A memory controller is provided. The memory controller is suitable for a pseudo static random access memory. The memory controller includes a mode register, a mode register write controller and a latency controller. The mode register is configured to generate a latency control signal according to a write instruction signal. The mode register write controller is configured to generate the write instruction signal during a mode register write operation and generate a write mask signal according to a chip selection signal. The latency controller generates a latency type control signal according to the latency control signal and the write mask signal.

10 Claims, 6 Drawing Sheets

MEMORY CONTROLLER

CROSS-REFERENCE TO RELATED APPLICATION

This application claims the priority benefit of Japan application serial no. 2020-107885, filed on Jun. 23, 2020. The entirety of the above-mentioned patent application is hereby incorporated by reference herein and made a part of this specification.

BACKGROUND

1. Technical Field

The disclosure relates to a memory technology, in particular, to a memory controller.

2. Description of Related Art

A pseudo static random access memory (hereinafter referred to as pSRAM) uses a dynamic random access memory (DRAM) as a memory cell array to store data. Furthermore, an access interface of the DRAM is redesigned to be compatible with an access interface of a static random access memory (SRAM), and a characteristic of an access timing sequence of the DRAM is also similar to that of the SRAM.

In the conventional memory technology, the memory controller is usually used to determine whether a self-refresh collision occurs in the pSRAM, and the memory controller is used to control the state of the latency control signal LTCX2_t generated by the mode register and the latency type control signal LTNCY2_t generated by the latency controller to set the latency type of the pSRAM access latency.

Figure 1A:
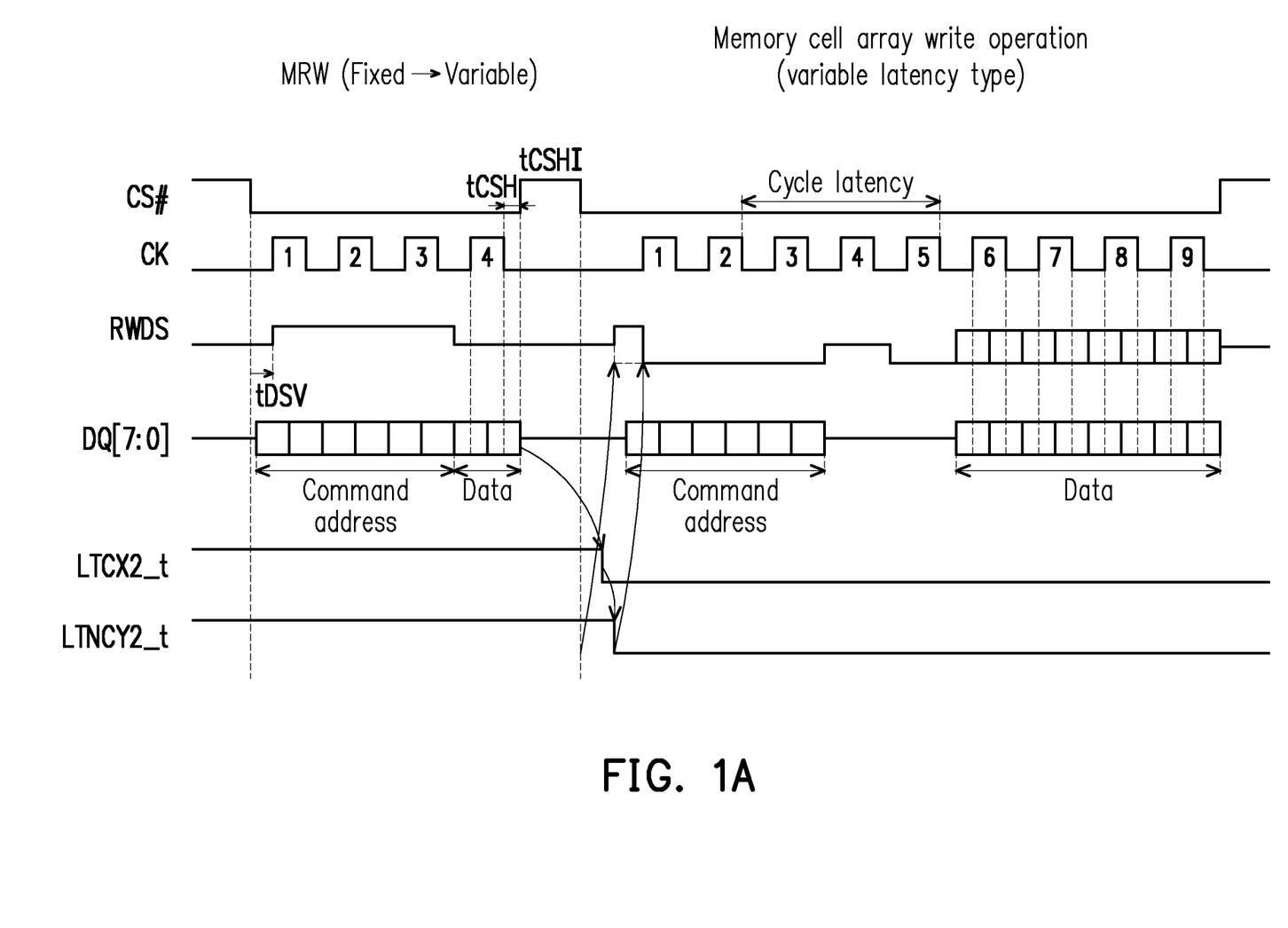
FIG. 1A and FIG. 1B are diagrams illustrating signal timing sequences of conventional pSRAMs.
Figure 1B:
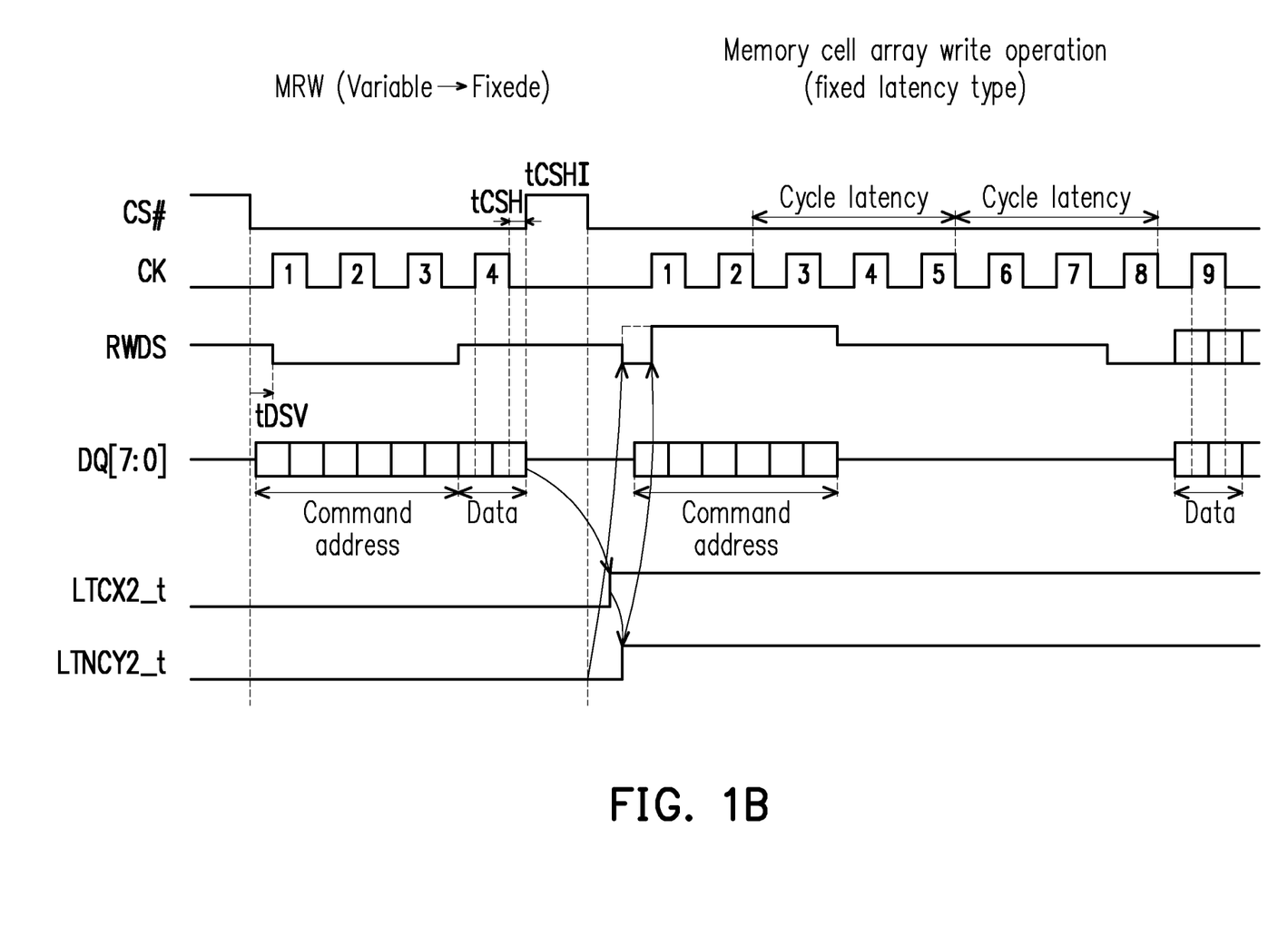

FIG. 1A and FIG. 1B are diagrams illustrating signal timing sequences of conventional pSRAMs. Please refer to FIG. 1A and FIG. 1B, which are signal timing sequence diagrams respectively corresponding to the pSRAM, when the pSRAM performs a mode register writer (MRW) operation and is in a write mode and the memory controller determines that a self-refresh collision has not occurred and adjusts the access latency of the pSRAM to different latency types.

In the scenario of FIG. 1A, when the memory controller is to adjust the access latency of the pSRAM from 2 times the latency time to 1 times the latency time (that is, to switch the latency type from a fixed latency type to a variable latency type), the inverted chip select signal (CS#) of the pSRAM is set to a low voltage level, and the latency control signal LTCX2_t and the latency type control signal LTNCY2_t at this time will be set to a high voltage level first.

However, in the conventional technology, because of the short reaction time of the time interval (i.e. tCSH and tCSHI) for the inverted chip select signal CS# to switch from the low voltage level to the high voltage level, the latency control signal LTCX2_t and the latency type control signal LTNCY2_t cannot be immediately switched to the low voltage level in the time interval.

In this case, a malfunction may occur in the read/write data strobe signal RWDS output by the read/write data strobe pin (hereinafter referred to as the RWDS pin) when the memory cell array performs a write operation.

In contrast, in the scenario of FIG. 1B, when the memory controller is to adjust the access latency of the pSRAM from 1 times the latency time to 2 times the latency time (that is, to switch the latency type from a variable latency type to a fixed latency type), the inverted chip select signal (CS#) of the pSRAM is set to a low voltage level, and the latency control signal LTCX2_t and the latency type control signal LTNCY2_t at this time will be set to the low voltage level first.

However, because of the short reaction time of the time interval (i.e. tCSH and tCSHI) for the inverted chip select signal CS# to switch from the low voltage level to the high voltage level, the latency control signal LTCX2_t and the latency type control signal LTNCY2_t cannot be immediately switched to the high voltage level in the time interval.

In this case, a malfunction may also occur in the read/write data strobe signal RWDS output by the RWDS pin when the memory cell array performs a write operation.

In other words, in the case of FIG. 1A and FIG. 1B described above, the read/write data strobe signal RWDS output by the RWDS pin is affected by the time interval (i.e. tCSH and tCSHI) being too short, a malfunction may occur in the read/write data strobe signal RWDS when the memory cell array performs a write operation, which further causes the pSRAM to fail to write valid data under correct timing sequence control and causes the overall memory system to fail to operate normally.

SUMMARY

The disclosure provides a memory controller that effectively reduces the malfunction of the memory controller when the memory controller is setting the latency type of the access latency of a pSRAM, thereby improving the operation quality of the memory system.

The memory controller is suitable for a pSRAM. The memory controller includes a mode register, a mode register write controller and a latency controller. The mode register is configured to generate a latency control signal according to a write instruction signal. The mode register write controller is configured to generate the write instruction signal during a mode register write operation and generate a write mask signal according to a chip selection signal. The latency controller is coupled to the mode register and the mode register write controller and generates a latency type control signal according to the latency control signal and the write mask signal.

In summary, the memory controller of the embodiments allows the latency controller to control the latency type control signal to be maintained in the enabled state according to the write mask signal with a high voltage level when the memory cell array performs a write operation and the inverted chip select signal is disabled. In this way, a malfunction does not occur in the read/write data strobe signal output by the RWDS pin when the memory cell array performs a write operation, thereby effectively improving the operation quality of the memory system.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 2:
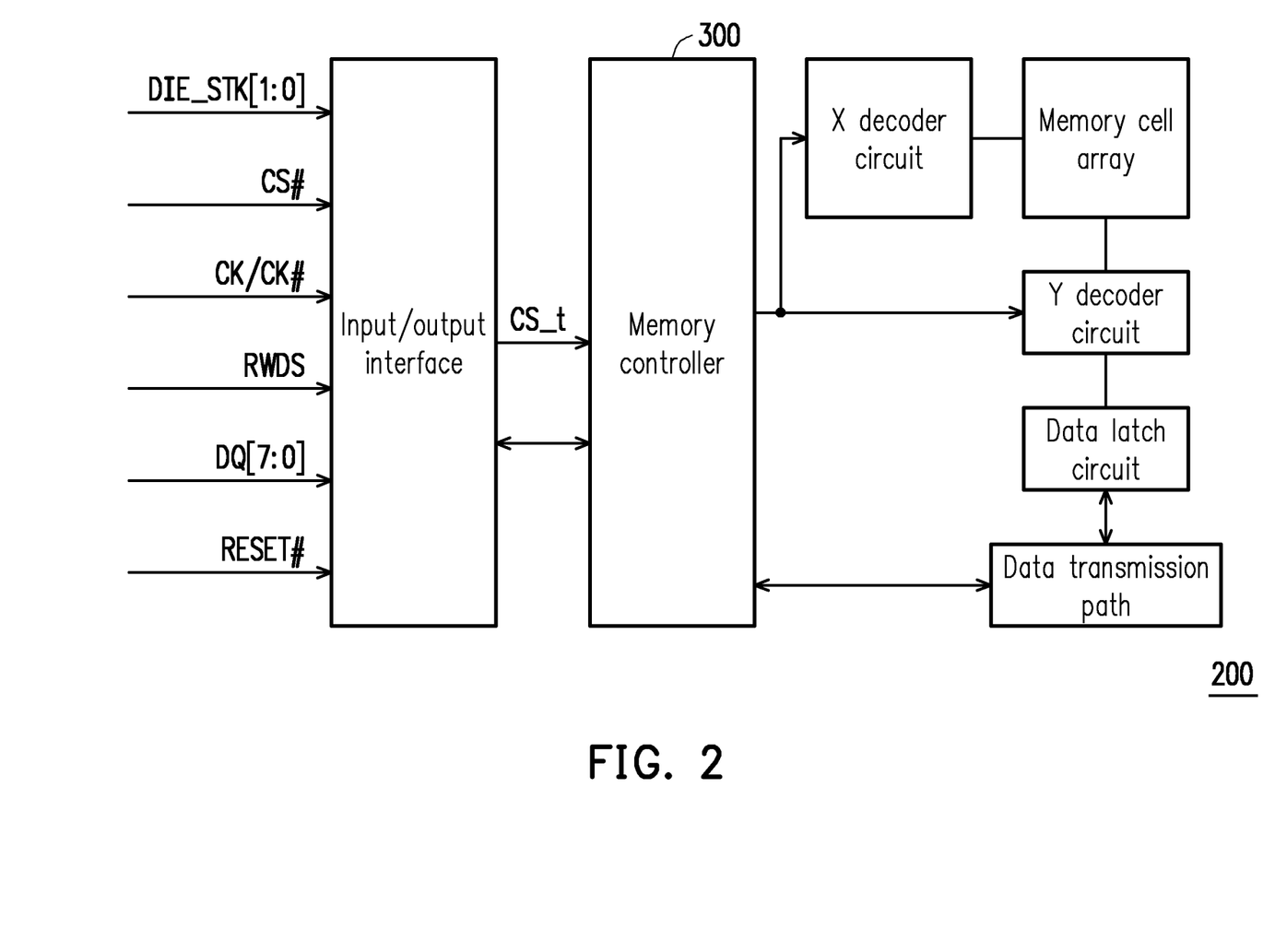
FIG. 2 is a schematic diagram illustrating a pSRAM according to an embodiment of the disclosure.

FIG. 2 is a schematic diagram illustrating a pSRAM according to an embodiment of the disclosure. Referring to FIG. 2, a pSRAM 200 includes a memory controller 300, an input/output interface, an X decoder circuit, a Y decoder circuit, a memory cell array, a data latch circuit, and a data transmission path. The pSRAM 200 in the present embodiment may be, for example, a xSPI pSRAM or a HyperRAM pSRAM using an Expanded Serial Peripheral Interface (hereinafter referred to as xSPI) or a HyperBus™ as an access interface, but the disclosure is not limited thereto.

In the present embodiment, the input/output interface of the pSRAM 200 may provide a chip select signal CS_t to the memory controller 300 according to an inverted chip select signal CS#. When the chip select signal CS_t is enabled (at a high voltage level for example), the pSRAM 200 may perform a data access operation. When the chip select signal CS_t is disabled (at a low voltage level for example), the pSRAM 200 cannot perform the data access operation. In the present embodiment, the state of chip select signal CS_t and the state of the inverted chip select signal CS# may be complementary to each other.

It should be noted that adequate teaching, suggestions and implementation instructions on the detailed function and implementation of the memory controller 300, the input/output interface, the X decoder circuit, the Y decoder circuit, the memory cell array, the data latch circuit, and the data transmission path shown in FIG. 2 may be obtained from the common knowledge in the art.

Figure 3:
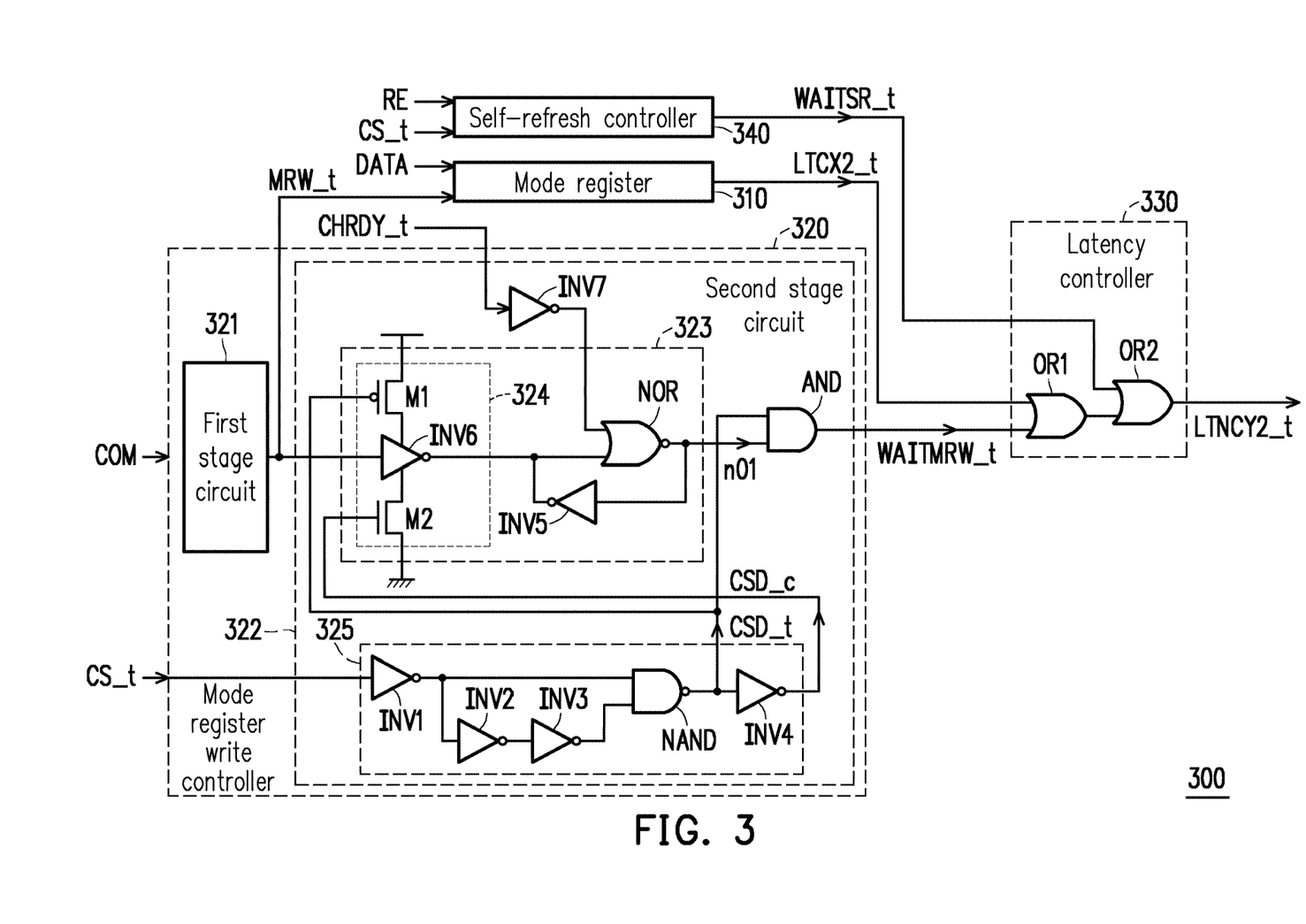
FIG. 3 is a schematic circuit diagram of a memory controller shown in FIG. 2 according to an embodiment of the disclosure.

FIG. 3 is a schematic circuit diagram of a memory controller shown in FIG. 2 according to an embodiment of the disclosure. Referring to FIG. 3, the memory controller 300 may be applied to the memory controller of the pSRAM 200 shown in FIG. 2. In the present embodiment, the memory controller 300 includes a mode register 310, a mode register write controller 320, a latency controller 330, and a self-refresh controller 340.

In the present embodiment, the mode register 310 receives a write instruction signal MRW_t and a mode register write data DATA, and generates a latency control signal LTCX2_t according to the write instruction signal MRW_t and the mode register write data DATA. When the latency control signal LTCX2_t is enabled (at a high voltage level for example), the latency control signal LTCX2_t may instruct the latency controller 330 to generate a latency type control signal LTNCY2_t for controlling the access latency of the pSRAM 200 to be a first type. In contrast, when the latency control signal LTCX2_t is disabled (at a low voltage level for example), the latency control signal LTCX2_t may instruct the latency controller 330 to generate the latency type control signal LTNCY2_t for controlling the access latency of the pSRAM 200 to be a second type.

The self-refresh controller 340 receives a self-refresh request RE and the chip select signal CS_t, and generates a self-refresh wait signal WAITSR_t according to the self-refresh request RE and the chip select signal CS_t.

In the present embodiment, the mode register write controller 320 includes a first stage circuit 321 and a second stage circuit 322. The mode register write controller 320 may receive a command COM through the first stage circuit 321, and generate the write instruction signal MRW_t in a mode register write (MRW) operation according to the command COM. In this way, the mode register write controller 320 may determine whether the pSRAM 200 performs the MRW operation through the write instruction signal MRW_t.

On the other hand, the second stage circuit 322 is coupled to the first stage circuit 321. The second stage circuit 322 may generate a write mask signal WAITMRW_t according to the write instruction signal MRW_t, the chip select signal CS_t and a initialization control signal CHRDY_t.

In specific, the second stage circuit 322 includes a latch 323, a pulse width adjustment circuit 325, a logic gate AND, and an inverter INV7. The logic gate in the present embodiment may be an AND gate, for example, but the disclosure is not limited thereto.

In the present embodiment, the pulse width adjustment circuit 325 may receive the chip select signal CS_t and adjust the pulse width of the chip select signal CS_t to generate a control signal CSD_t and an inverted control signal CSD_c that are complementary to each other. In addition, the latch 323 is coupled to the pulse width adjustment circuit 325 and the first stage circuit 321. The latch 323 may generate an output signal n01 according to the control signal CSD_t, the inverted control signal CSD_c, and the write instruction signal MRW_t.

On the other hand, a first input terminal of the logic gate AND is coupled to the pulse width adjustment circuit 325 to receive the control signal CSD_t, and a second input terminal of the logic gate AND is coupled to the latch 323 to receive the output signal n01. The logic gate AND may perform an AND operation on the control signal CSD_t and the output signal n01 to generate a write mask signal WAITMRW_t at an output terminal of the logic gate AND. In addition, an input terminal of the inverter INV7 receives the initialization control signal CHRDY_t, and an output terminal of the inverter INV7 is coupled to the latch 323.

Regarding the detailed circuit architecture of the pulse width adjustment circuit 325, the pulse width adjustment circuit 325 includes an inverter INV1, an inverter INV4, a plurality of inverters connected in series (such as INV2 and INV3), and a NAND gate NAND. In detail, an input terminal of inverter INV1 receives the chip select signal CS_t. An input terminal of the plurality of inverters connected in series is coupled to an output terminal of the inverter INV1. A first input terminal of the inverter NAND is coupled to the output terminal of the inverter INV1, and a second input terminal of the inverter NAND is coupled to an output terminal of the plurality of inverters connected in series. Also, the NAND gate NAND may perform an inverse AND operation on signals generated by the inverter INV1 and signals generated by the plurality of inverters connected in series to generate the control signal CSD_t at an output terminal of the NAND gate.

In addition, an input terminal of the inverter INV4 is coupled to the output terminal of the inverter NAND to receive the control signal CSD_t. Also, the inverter INV4 may perform an inverse operation on the control signal CSD_t to generate an inverted control signal CSD_c at an output of the inverter INV4.

Regarding the detailed circuit architecture of the latch 323, the latch 323 includes a tri-state inverter 324, an inverter INV5, and a NOR gate NOR. The tri-state inverter 324 of the present embodiment may include an inverter INV6, a P-type transistor M1, and an N-type transistor M2.

In detail, in the tri-state inverter 324, an input terminal of the inverter INV6 may receive the write instruction signal MRW_t. The P-type transistor M1 may be controlled by the control signal CSD_t, and the N-type transistor M2 may be controlled by the inverted control signal CSD_c. Also, the latch 323 may enable the tri-state inverter 324 according to the state of the control signal CSD_t and the state of the inverted control signal CSD_c, to allow the P-type transistor M1 and the N-type transistor M2 to be turned on respectively according to the control signal CSD_t and the inverted control signal CSD_c, so that the inverter INV6 may generate an inverted write instruction signal MRW_t at an output terminal.

In addition, a first input terminal of the NOR gate NOR is coupled to an output terminal of the inverter INV7, and a second input terminal of the NOR gate NOR is coupled to the output terminal of the inverter INV6. Moreover, the NOR gate NOR may perform an inverse OR operation on signals generated by the inverter INV7 and the inverted write instruction signal MRW_t to generate the output signal n01 at an output of the NOR gate NOR. In addition, the inverter INV5 is coupled between the output terminal of the NOR gate NOR and the second input terminal of the NOR gate NOR. Therefore, the latch 323 may feedback the output signal n01 to the second input terminal of the NOR gate NOR through the inverter INV5.

It should be noted that the latch 323, the tri-state inverter 324, and the pulse width adjustment circuit 325 of the present embodiment may be implemented by a latch, a tri-state inverter, and a pulse width adjustment circuit known to those skilled in the art, and the disclosure is not limited to the architecture proposed above.

On the other hand, the latency controller 330 is coupled to the mode register 310, the mode register write controller 320, and the self-refresh controller 340. In the present embodiment, the latency controller 330 may generate the latency type control signal LTNCY2_t according to the self-refresh wait signal WAITSR_t, the latency control signal LTCX2_t, and the write mask signal WAITMRW_t.

It is worth mentioning that the latency controller 330 of the present embodiment may control the access latency of the pSRAM 200 to be the first type or the second type through the latency type control signal LTNCY2_t. For example, when the latency type control signal LTNCY2_t is enabled (at a high voltage level for example), the latency type of the access latency may be defined as a fixed latency type (corresponding to the first type). When the latency type control signal LTNCY2_t is disabled (at a low voltage level for example), the latency type of the access latency may be defined as a variable latency type (corresponding to the second type).

Further, in the present embodiment, the first type may correspond to a first latency time, the second type may correspond to a second latency time, and the first latency time is an integer multiple of the second latency time (2 times for example, but the disclosure is not limited thereto).

Regarding the detailed circuit architecture of latency controller 330, the latency controller 330 includes a logic gate OR1 and a logic gate OR2. The logic gate OR1 and the logic gate OR2 may be an OR gate for example, but the disclosure is not limited thereto. Specifically, a first input terminal of the logic gate OR1 is coupled to the mode register 310 to receive the latency control signal LTCX2_t, and a second input terminal of the logic gate OR1 is coupled to the mode register write controller 320 to receive the write mask signal WAITMRW_t.

Moreover, a first input terminal of the logic gate OR2 is coupled to the self-refresh controller 340 to receive a self-refresh wait signal WAITSR_t, and a second input terminal of the logic gate OR2 is coupled to an output terminal of the logic gate OR1. Also, the logic gate OR2 may perform an OR operation on signals output by the self-refresh wait signal WAITSR_t and the logic gate OR1 to generate a latency type control signal LTNCY2_t at an output terminal.

In other words, in the present embodiment, when any one of self-refresh wait signal WAITSR_t, the latency control signal LTCX2_t and the write mask signal WAITMRW_t is set to be enabled (at a high voltage level for example), the latency controller 330 may control the access latency of the pSRAM 200 to be the first type (that is, the fixed latency type) through the latency type control signal LTNCY2_t.

Figure 4:
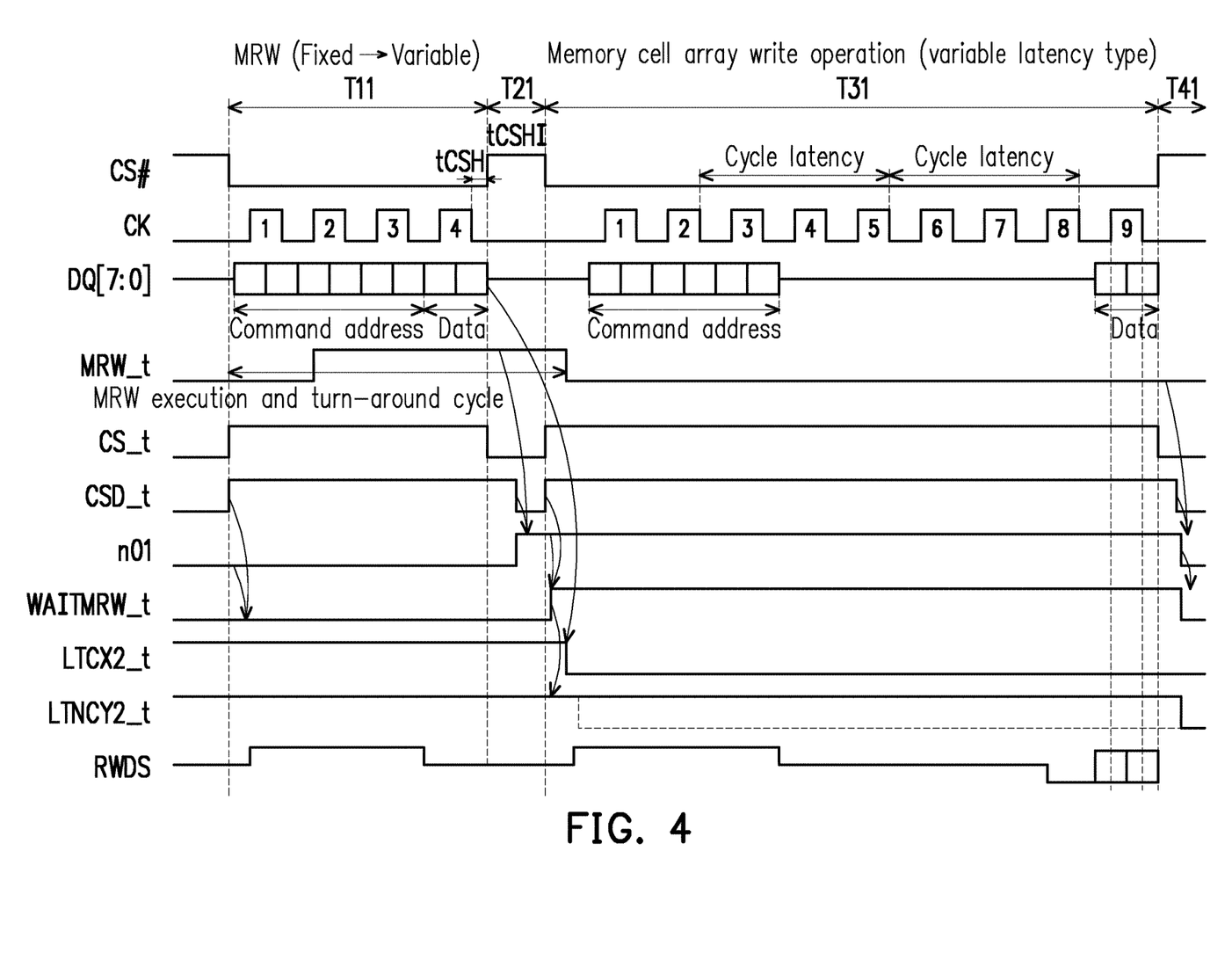
FIG. 4 is a signal timing sequence diagram illustrating a memory controller controlling an access latency of a pSRAM to switch from a fixed latency type to a variable latency type according to an embodiment of the disclosure.

FIG. 4 is a signal timing sequence diagram illustrating a memory controller controlling an access latency of a pSRAM to switch from a fixed latency type to a variable latency type according to an embodiment of the disclosure. The embodiment of FIG. 4 assumes that the pSRAM 200 operates in a write mode and no self-refresh collision occurs.

Please refer to FIG. 2 to FIG. 4 at the same time. In the present embodiment, when the pSRAM 200 operates at an initial time before activating (before booting for example), the memory controller 300 does not perform the MRW operation, and the initialization control signal CHRDY_t may be set to a disabled state (at a low voltage level for example). In this case, the latch 323 of the mode register write controller 320 may initialize the output signal n01 according to the disabled initialization control signal CHRDY_t, so that the output signal n01 is set to a low voltage level state at the initial time.

Then, after the pSRAM 200 completes a power-up operation, the initialization control signal CHRDY_t may be set to an enabled state (at a high voltage level for example) again and completes the state of initializing the output signal n01.

Next, when the pSRAM 200 operates at time interval T11, both the inverted chip select signal CS# and the write instruction signal MRW_t are set to a disabled state (at a low voltage level for example). At this time, the pulse width adjustment circuit 325 may generate the control signal CSD_t with a high voltage level and the inverted control signal CSD_c with a low voltage level according to the enabled (at a high voltage level for example) chip select signal CS_t.

In this case, the transistor M1 and the transistor M2 of the tri-state inverter 324 are disconnected respectively according to the control signal CSD_t and the inverted control signal CSD_c, to allow the latch 323 to latch the state of the output signal n01 (that is, the state in which the output signal n01 is maintained at a low voltage level). At the same time, the mode register write controller 320 may generate a disabled (at a low voltage level for example) write mask signal WAITMRW_t according to the control signal CSD_t with a high voltage level and the output signal n01 with a low voltage level.

It is worth mentioning that when the pSRAM 200 operates at an initial time of time interval T11, the mode register write controller 320 may determine that the memory controller 300 has not performed a MRW operation according to the write instruction signal MRW_t.

Then, when the pSRAM 200 operates at time interval T11 after time interval T21, both the inverted chip select signal CS# and the write instruction signal MRW_t are set to an enabled state (at a high voltage level example). At this time, the pulse width adjustment circuit 325 may generate the control signal CSD_t with a low voltage level and an inverted control signal CSD_c with a high voltage level according to the disabled (at a low voltage level for example) chip select signal CS_t.

In this case, the transistor M1 and the transistor M2 of the tri-state inverter 324 will be turned on respectively according to the control signal CSD_t and the inverted control signal CSD_c, to allow the latch 323 to generate the output signal n01 with a high voltage level according to the write instruction signal MRW_t with a high voltage level and the initialization control signal CHRDY_t with a high voltage level. Also, the mode register write controller 320 may generate the disabled (at a low voltage level for example) write mask signal WAITMRW_t according to the output signal n01 and the control signal CSD_t.

On the other hand, when the pSRAM 200 operates at time interval T21 after time interval T31, it means that a memory cell array of the pSRAM 200 may start a write operation. At this time, the inverted chip select signal CS# is set to the disabled state (at a low voltage level for example), and the write instruction signal MRW_t may be maintained at the enabled state (e.g. high voltage level) at the initial time of time interval T31. Therefore, the pulse width adjustment circuit 325 may generate the control signal CSD_t with a high voltage level and the inverted control signal CSD_c with a low voltage level according to the enabled (at a high voltage level for example) chip select signal CS_t.

In this case, the transistor M1 and the transistor M2 of the tri-state inverter 324 are disconnected respectively according to the control signal CSD_t and the inverted control signal CSD_c, to allow the latch 323 to latch the state of the output signal n01 (that is, the state in which the output signal n01 is maintained at a high voltage level).

At the same time, in the present embodiment, the mode register write controller 320 may generate the enabled (at a high voltage level for example write mask signal WAITMRW_t) according to the control signal CSD_t with a high voltage level and the output signal n01 with a high voltage level.

In other words, when the memory cell array of the pSRAM 200 performs the write operation (i.e. time interval T31), the latency controller 330 may generate the enabled latency type control signal LTNCY2_t according to the write mask signal WAITMRW_t with a high voltage level, so that a malfunction does not occur in the read/write data strobe signal RWDS output by a RWDS pin when the memory cell array performs the write operation.

In addition, in the present embodiment, at the initial time when the memory cell array of the pSRAM 200 performs the write operation, the mode register write controller 320 may determine that the pSRAM 200 is performing the MRW operation. Also, since the mode register 310 generates the disabled latency control signal LTCX2_t according to the write instruction signal MRW_t, the memory controller 300 may set the access latency of the pSRAM 200 to the variable latency type when the memory cell array of the pSRAM 200 performs the write operation, and the latency type control signal LTNCY2_t may still be maintained at a high voltage level.

Next, when the pSRAM 200 operates at a time interval T41 after the time interval T31, it means that the memory cell array of the pSRAM 200 has completed the write operation. At this time, the inverted chip select signal CS# is set to the enabled state (at a high voltage level for example), and the write instruction signal MRW_t is set to a disabled state (at a low voltage level for example). Therefore, the pulse width adjustment circuit 325 may generate the control signal CSD_t with a low voltage level and the inverted control signal CSD_c with a high voltage level according to the disabled (at a low voltage level for example) chip select signal CS_t.

In this case, the transistor M1 and the transistor M2 of the tri-state inverter 324 are turned on respectively according to the control signal CSD_t and the inverted control signal CSD_c, to allow the latch 323 to generate the output signal n01 with a low voltage level according to the write instruction signal MRW_t with a low voltage level and the initialization control signal CHRDY_t with a high voltage level. Also, the mode register write controller 320 may generate the disabled (at a low voltage level for example) write mask signal WAITMRW_t according to the output signal n01 and the control signal CSD_t.

Figure 5:
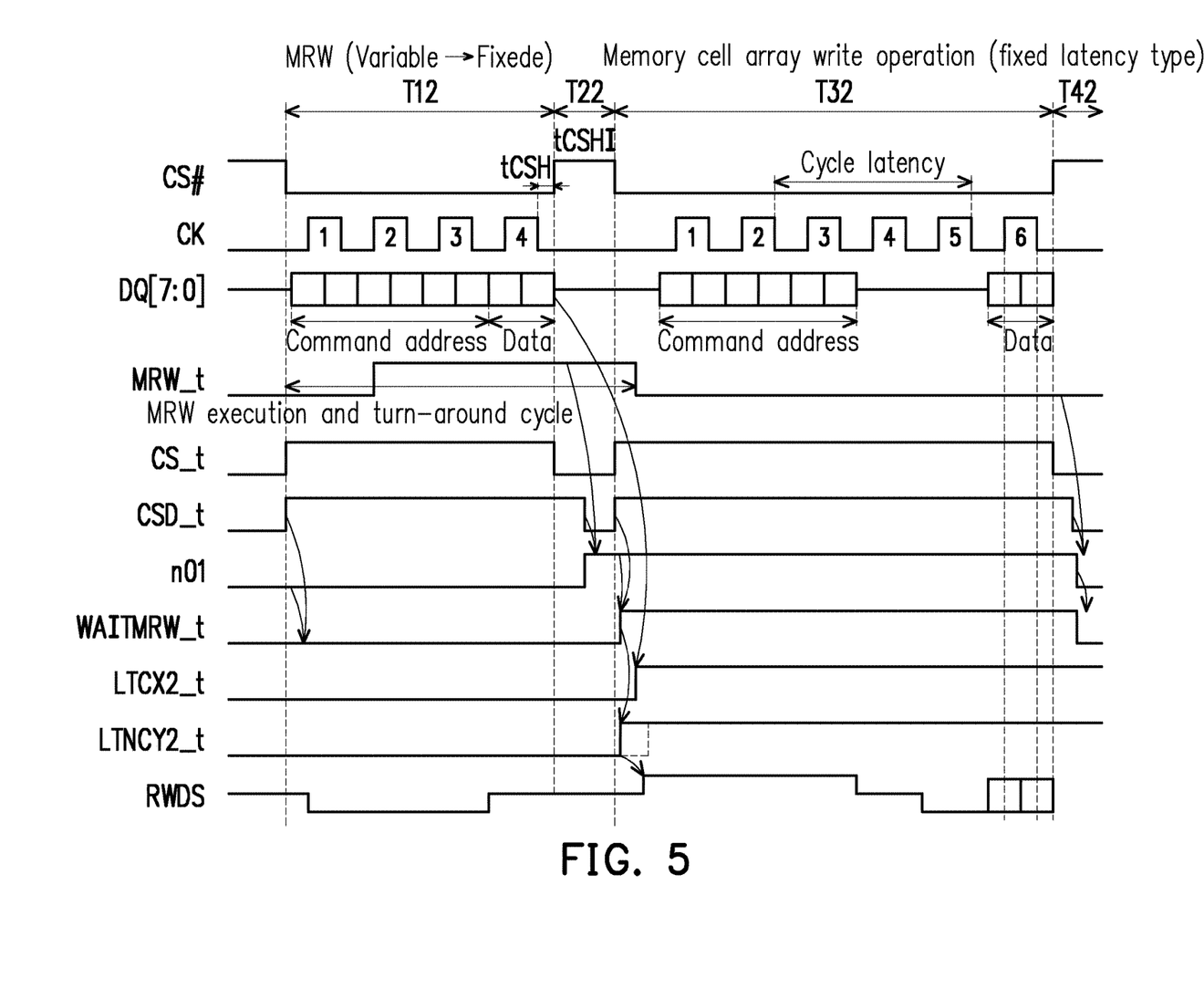
FIG. 5 is a signal timing sequence diagram illustrating a memory controller controlling an access latency of pSRAM to switch from a variable latency type to a fixed latency type according to an embodiment of the disclosure.

FIG. 5 is a signal timing sequence diagram illustrating a memory controller controlling an access latency of a pSRAM to switch from a variable latency type to a fixed latency type according to an embodiment of the disclosure. The embodiment of FIG. 5 assumes that the pSRAM 200 operates in a write mode and no self-refresh collision occurs.

It should be noted that, in the embodiment shown in FIG. 5, the operation details of the pSRAM 200 operating at time interval T12 to T22 can be referred to in the related description of time interval T11 to T21 in the embodiment shown in FIG. 4, and are not repeated here.

Please refer to FIG. 2, FIG. 3 and FIG. 5 at the same time. When the pSRAM 200 operates at a time interval T32 after the time interval T22, it means that the memory cell array of the pSRAM 200 may start the write operation. At this time, the inverted chip select signal CS# is set to a disabled state (at a low voltage level for example), and the write instruction signal MRW_t may be maintained at the enabled state (e.g. high voltage level) at the initial time of time interval T32. Therefore, the pulse width adjustment circuit 325 may generate the control signal CSD_t with a high voltage level and the inverted control signal CSD_c with a low voltage level according to the enabled (at a high voltage level for example) chip select signal CS_t.

In this case, the transistor M1 and the transistor M2 of the tri-state inverter 324 are disconnected respectively according to the control signal CSD_t and the inverted control signal CSD_c, so allow the latch 323 to latch the state of the output signal n01 (that is, the state in which the output signal n01 is maintained at a high voltage level).

At the same time, the mode register write controller 320 may generate the enabled (at a high voltage level for example) write mask signal WAITMRW_t according to the control signal CSD_t with a high voltage level and the output signal n01 with a high voltage level.

In other words, when the memory cell array of the pSRAM 200 performs the write operation (i.e. time interval T32), the latency controller 330 may generate the enabled latency type control signal LTNCY2_t according to the write mask signal WAITMRW_t with a high voltage level, so that a malfunction does not occur in the read/write data strobe signal RWDS output by the RWDS pin when the memory cell array performs the write operation.

In addition, in the present embodiment, at the initial time when the memory cell array of the pSRAM 200 performs the write operation, the mode register write controller 320 may determine that the pSRAM 200 is performing the MRW operation. Moreover, since at this time the mode register 310 generates the enabled latency control signal LTCX2_t according to the write instruction signal MRW_t, the memory controller 300 may set the access latency of the pSRAM 200 to the fixed latency type when the memory cell array of the pSRAM 200 performs the write operation, and the latency type control signal LTNCY2_t may still be maintained at a high voltage level.

Next, when the pSRAM 200 operates at a time interval T42 after the time interval T32, it means that the memory cell array of the pSRAM 200 has completed the write operation. At this time, the inverted chip select signal CS# is set to the enabled state (at a high voltage level for example), and the write instruction signal MRW_t is set to a disabled state (at a low voltage level for example). Therefore, the pulse width adjustment circuit 325 may generate the control signal CSD_t with a low voltage level and the inverted control signal CSD_c with a high voltage level according to the disabled (at a low voltage level for example) chip select signal CS_t.

In this case, the transistor M1 and the transistor M2 of the tri-state inverter 324 are turned on respectively according to the control signal CSD_t and the inverted control signal CSD_c, to allow the latch 323 to generate the output signal n01 with a low voltage level according to the write instruction signal MRW_t with a low voltage level and the initialization control signal CHRDY_t with a high voltage level. Also, the mode register write controller 320 may generate the disabled (at a low voltage level for example) write mask signal WAITMRW_t according to the output signal n01 and the control signal CSD_t.

It can be known from the description of the embodiments of FIG. 4 and FIG. 5 above that whether the memory controller 300 is to switch the access latency of the pSRAM 200 from the variable latency type to the fixed latency type, or to switch the access latency of the pSRAM 200 from the fixed latency type to the variable latency type, and, even if the pSRAM 200 operates in the time interval tCSH, tCSHI of shorter reaction time, a malfunction does not occur in the read/write data strobe signal RWDS output by the RWDS pin of the present embodiment due to misinterpretation of the latency type when the memory cell array performs the write operation.

In summary, the memory controller of the embodiments allows the latency controller to control the latency type control signal to be maintained in the enabled state according to the write mask signal with a high voltage level when the memory cell array performs a write operation and the inverted chip select signal is disabled. In this way, a malfunction does not occur in the read/write data strobe signal output by the RWDS pin when the memory cell array performs a write operation, thereby effectively improving the operation quality of the memory system.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory controller for a pseudo static random access memory, the memory controller comprising:
   a mode register configured to generate a latency control signal according to a write instruction signal;
   a mode register write controller configured to generate the write instruction signal during a mode register write operation and generate a write mask signal according to a chip select signal, the write instruction signal and an initialization control signal; and
   a latency controller coupled to the mode register and the mode register write controller, generating a latency type control signal according to the latency control signal and the write mask signal.

2. The memory controller according to claim 1, wherein when the chip select signal is enabled, the mode register write controller determines according to the write instruction signal whether the mode register write operation is performed, and the mode register write controller generates the write mask signal according to the determination result, to allow the latency controller to control an access latency of the pseudo static random access memory to be a first type or a second type through the latency type control signal.

3. The memory controller according to claim 2, wherein when the write instruction signal instructs that the mode register write operation is performed, the mode register write controller generates the enabled write mask signal, to allow the latency controller to control the access latency of the pseudo static random access memory to be the first type through the latency type control signal.

4. The memory controller according to claim 3, wherein the first type corresponds to a first latency time and the second type corresponds to a second latency time, wherein the first latency time is an integer multiple of the second latency time.

5. The memory controller according to in claim 1, further comprising:
   a self-refresh controller configured to generate a self-refresh wait signal according to a self-refresh request and the chip select signal,
   wherein the latency controller is further coupled to the self-refresh controller and the latency controller further generates the latency type control signal according to the self-refresh wait signal.

6. The memory controller according to claim 5, wherein the latency controller comprises:
   a first logic gate, wherein a first input terminal of the first logic gate receives the latency control signal and a second input terminal of the first logic gate receives the write mask signal; and
   a second logic gate, wherein a first input terminal of the second logic gate receives the self-refresh wait signal, a second input terminal of the second logic gate is coupled to an output terminal of the first logic gate, and an output terminal of the second logic gate generates the latency type control signal.

7. The memory controller according to claim 5, wherein when any one of the self-refresh wait signal, the latency control signal, and the write mask signal is enabled, the latency controller controls the access latency of the pseudo static random access memory to be the first type through the latency type control signal.

8. The memory controller according to claim 1, wherein the mode register write controller comprises:
   a first stage circuit configured to generate the write instruction signal according to a command; and
   a second stage circuit coupled to the first stage circuit, generating the write mask signal according to the write instruction signal, the chip select signal, and the initialization control signal.

9. The memory controller according to claim 8, wherein the second stage circuit comprises:
- a pulse width adjustment circuit, receiving the chip select signal and generating a control signal and an inverted control signal according to the chip select signal;
- a latch coupled to the pulse width adjustment circuit and the first stage circuit, generating an output signal according to the control signal, the inverted control signal, and the write instruction signal; and
- a logic gate, wherein a first input terminal of the logic gate receives the control signal, a second input terminal of the logic gate receives the output signal, and an output terminal of the logic gate generates the write mask signal.

10. The memory controller according to claim 9, wherein the pulse width adjustment circuit adjusts a pulse width of the chip select signal to generate the control signal and the inverted control signal that are complementary to each other.

* * * * *